(12) United States Patent
Fujimoto

(10) Patent No.: US 12,403,673 B2
(45) Date of Patent: Sep. 2, 2025

(54) RESIN MULTILAYER SUBSTRATE AND METHOD FOR MANUFACTURING RESIN MULTILAYER SUBSTRATE

(71) Applicant: Murata Manufacturing Co., Ltd., Nagaokakyo (JP)

(72) Inventor: Asato Fujimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 385 days.

(21) Appl. No.: 18/096,620

(22) Filed: Jan. 13, 2023

(65) Prior Publication Data

US 2023/0158775 A1 May 25, 2023

Related U.S. Application Data

(63) Continuation of application No. PCT/JP2021/026064, filed on Jul. 12, 2021.

(30) Foreign Application Priority Data

Jul. 21, 2020 (JP) .................................. 2020-124365

(51) Int. Cl.
*B32B 15/08* (2006.01)
*B32B 38/10* (2006.01)

(52) U.S. Cl.
CPC .............. *B32B 15/08* (2013.01); *B32B 38/10* (2013.01); *B32B 2250/03* (2013.01); *B32B 2250/40* (2013.01); *B32B 2307/202* (2013.01)

(58) Field of Classification Search
CPC . B32B 15/08; B32B 2250/03; B32B 2250/40; B32B 2307/202; B32B 38/10;
(Continued)

(56) References Cited

U.S. PATENT DOCUMENTS

2007/0272434 A1 11/2007 Honjo et al.
2012/0097428 A1 4/2012 Kato et al.
(Continued)

FOREIGN PATENT DOCUMENTS

JP 0182595 A 6/1989
JP 06283860 A 10/1994
(Continued)

OTHER PUBLICATIONS

International Search Report in PCT/JP2021/026064, mailed Sep. 14, 2021, 3 pages.
(Continued)

*Primary Examiner* — Lawrence D Ferguson
(74) *Attorney, Agent, or Firm* — Keating & Bennett, LLP

(57) ABSTRACT

A metal foil layer includes a metal foil layer upper main surface, a metal foil layer lower main surface with a surface roughness greater than that of the metal foil layer upper main surface, and a metal foil layer side surface that is a surface of the metal foil layer excluding the metal foil layer upper main surface and the metal foil layer lower main surface. The metal foil layer upper main surface is in contact with an upper resin layer. The metal foil layer lower main surface is in contact with a lower resin layer. A portion of a lower main surface of the upper resin layer and a portion of an upper main surface of the lower resin layer are in contact with each other to define a layer interface. In a cross section of the metal foil layer, the metal foil layer side surface includes an outer point and an inner point where the upper resin layer is in contact with the side surface, and the inner point is below the outer point and inward of the outer point.

12 Claims, 11 Drawing Sheets

(58) Field of Classification Search
CPC .. G02B 6/3854; G02B 6/3886; H05K 1/0393; H05K 2201/0141; H05K 2201/0154; H05K 2201/09281; H05K 2201/098; H05K 3/363
See application file for complete search history.

(56) References Cited

U.S. PATENT DOCUMENTS

| | | |
|---|---|---|
| 2012/0138340 A1 | 6/2012 | Kato et al. |
| 2015/0018055 A1 | 1/2015 | Yosui |
| 2016/0095215 A1 | 3/2016 | Furutani |
| 2019/0371690 A1 | 12/2019 | Iwasaki et al. |
| 2021/0037644 A1 | 2/2021 | Abe |

FOREIGN PATENT DOCUMENTS

| | | | |
|---|---|---|---|
| JP | 2005223187 A | 8/2005 | |
| JP | 2007317900 A | 12/2007 | |
| JP | 2013041858 A | 2/2013 | |
| JP | 2014220309 A | 11/2014 | |
| JP | 2016066705 A | 4/2016 | |
| WO | 2011007659 A1 | 1/2011 | |
| WO | 2011018979 A1 | 2/2011 | |
| WO | 2014092153 A1 | 6/2014 | |
| WO | 2018155014 A1 | 8/2018 | |
| WO | 2019107430 A1 | 6/2019 | |

OTHER PUBLICATIONS

Written Opinion in PCT/JP2021/026064, mailed Sep. 14, 2021, 4 pages.
Office Action in JP2022-537928, mailed Dec. 12, 2023, 3 pages.

Fig.2
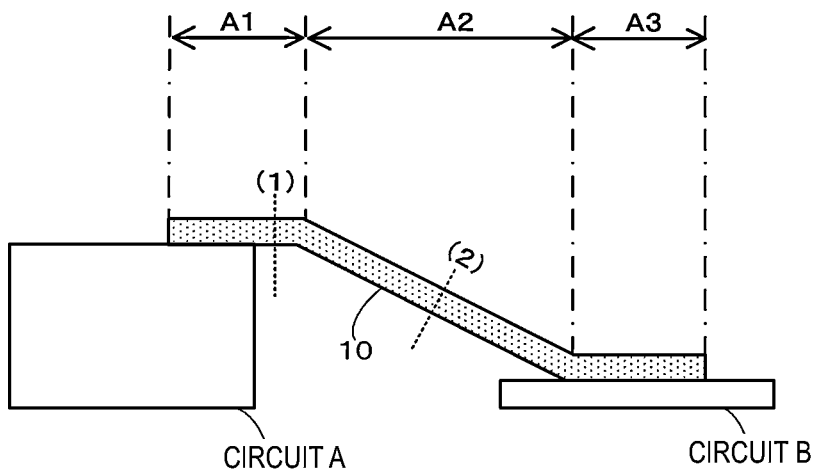
CIRCUIT A  CIRCUIT B
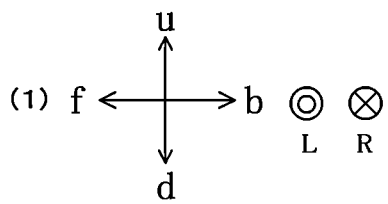 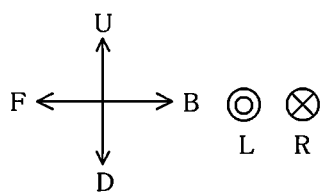
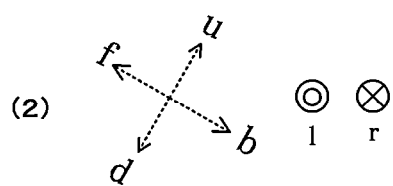
UP-DOWN DIRECTION: UD
FRONT-BACK DIRECTION: FB
LEFT-RIGHT DIRECTION: LR
MULTILAYER BODY UP-DOWN DIRECTION: ud
MULTILAYER BODY FRONT-BACK DIRECTION: fb
MULTILAYER BODY LEFT-RIGHT DIRECTION: lr Fig.5
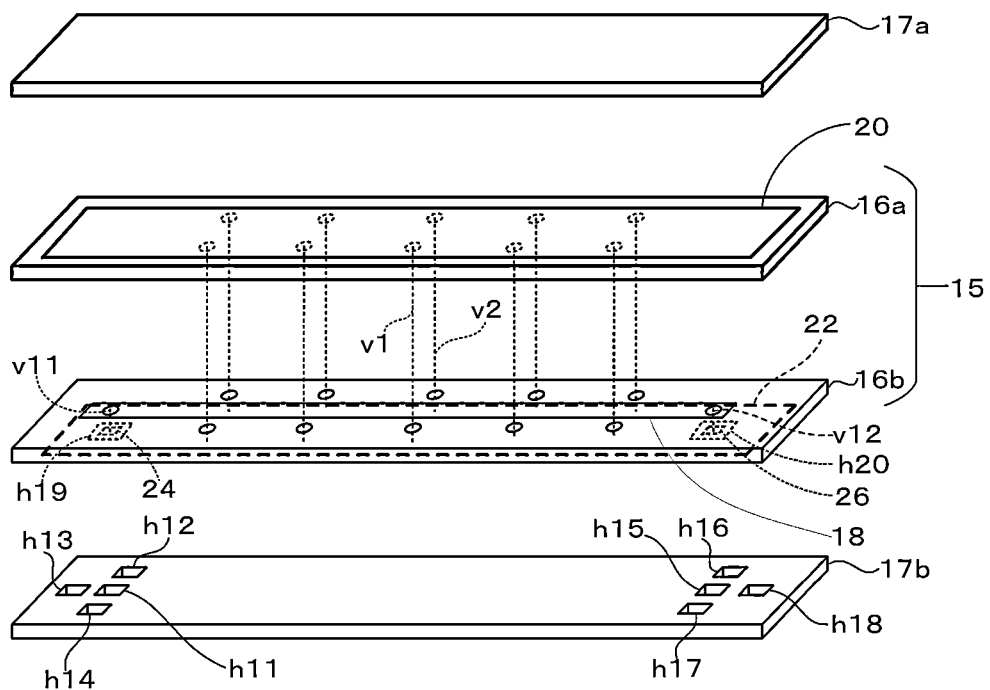
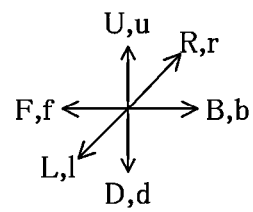

Fig.6
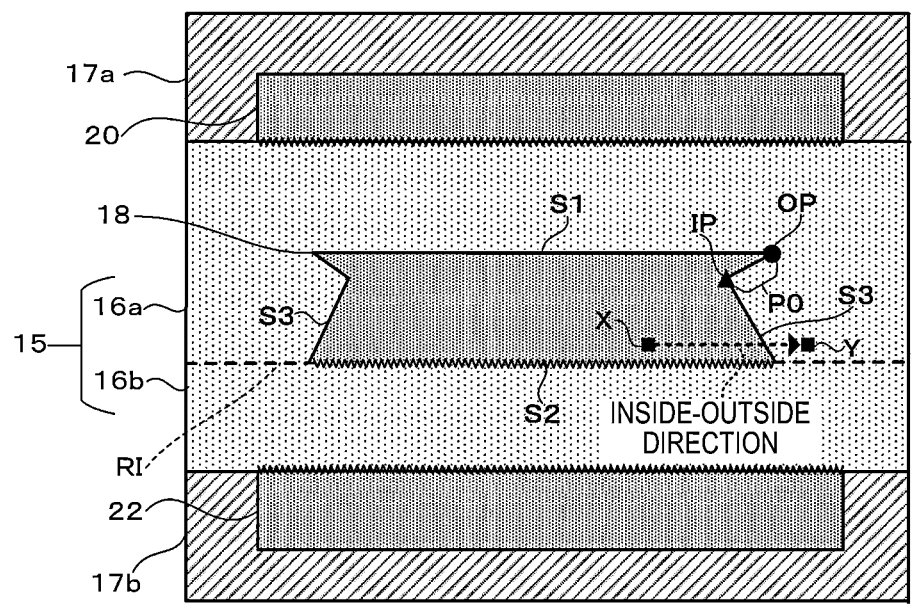
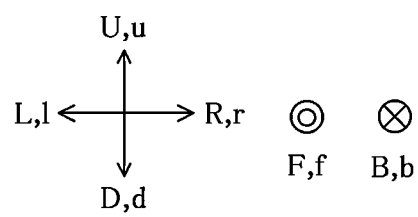

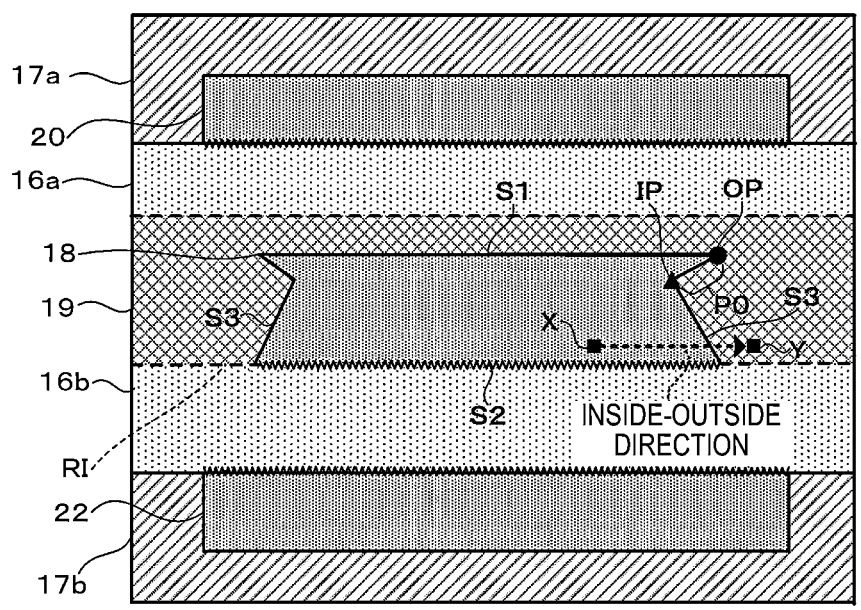
Fig. 7
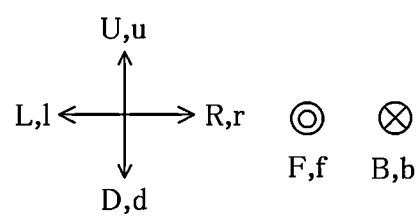

Fig. 8
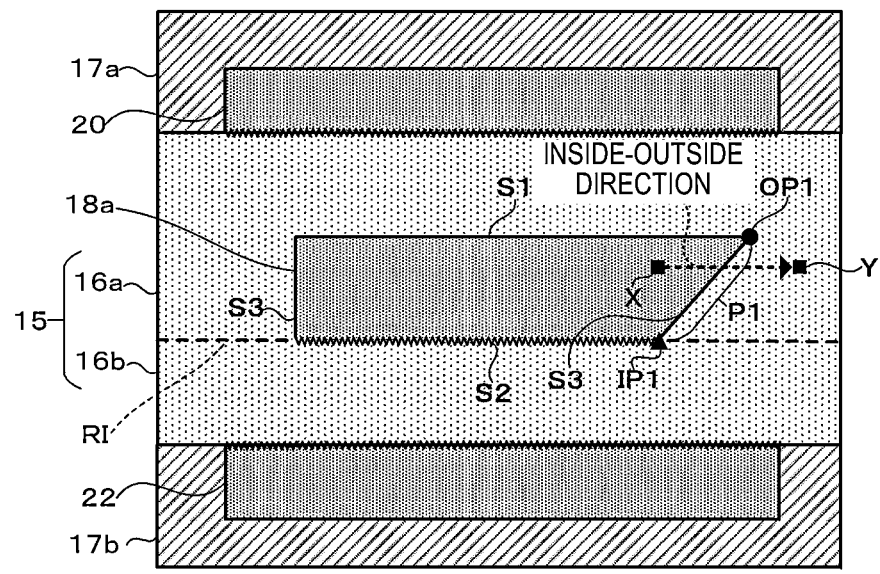
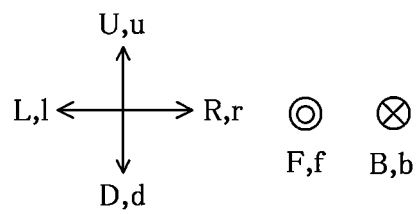

Fig.9
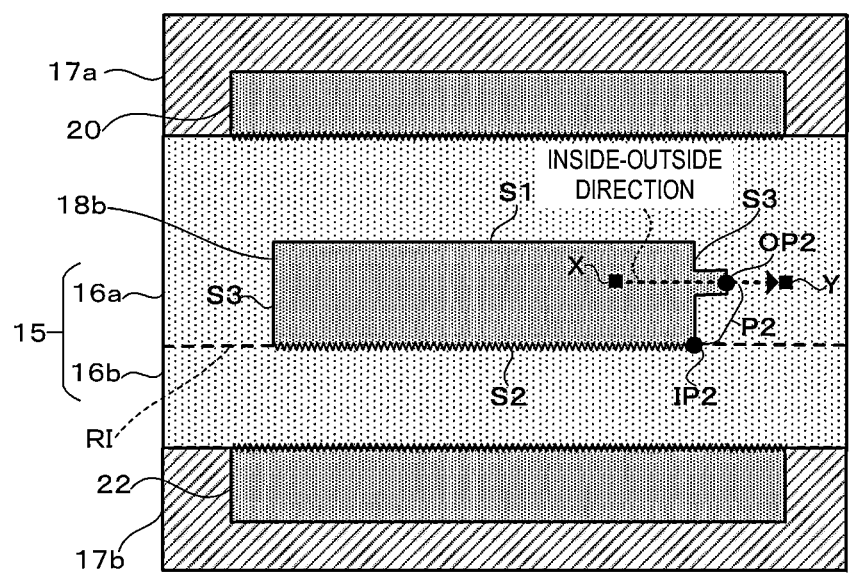
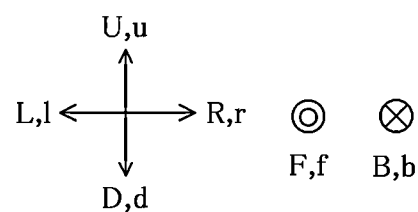

Fig.10
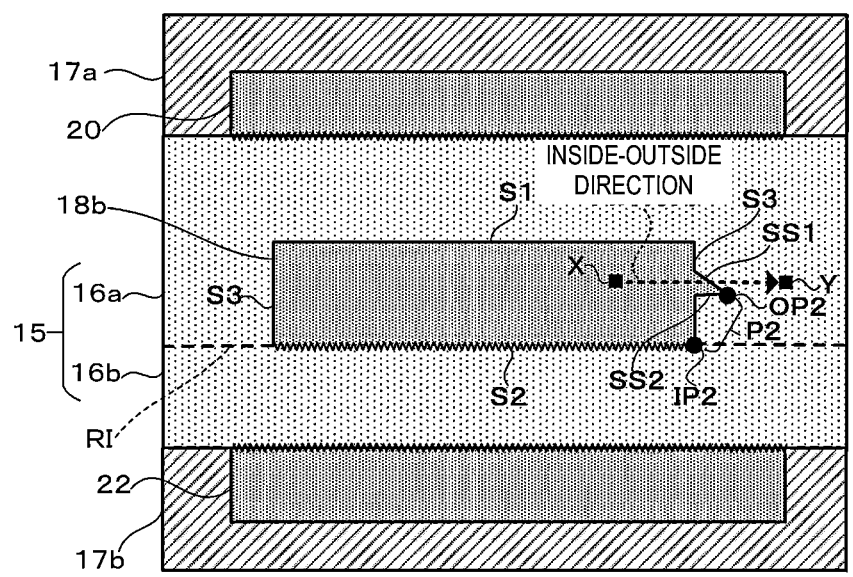
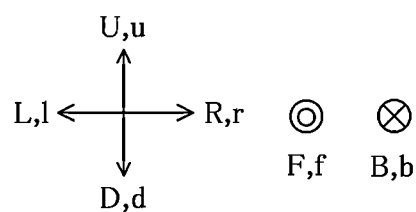

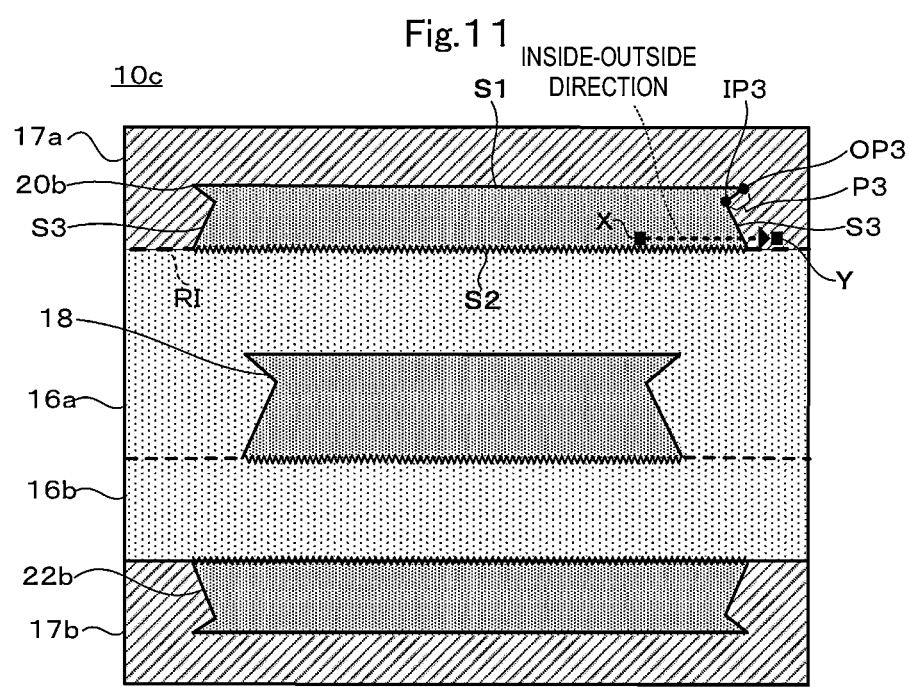
Fig. 11
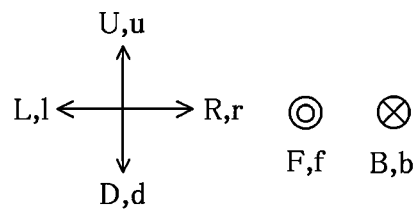

Fig.12
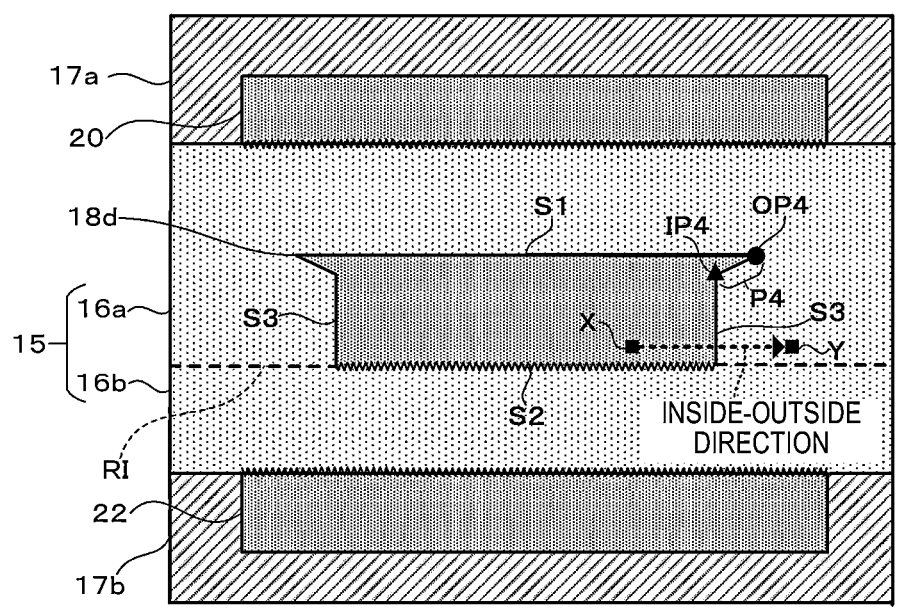
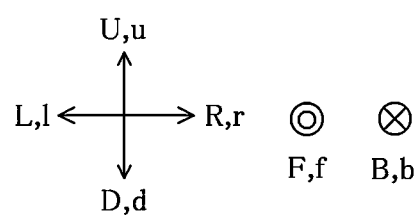

RESIN MULTILAYER SUBSTRATE AND METHOD FOR MANUFACTURING RESIN MULTILAYER SUBSTRATE

CROSS REFERENCE TO RELATED APPLICATIONS

This application claims the benefit of priority to Japanese Patent Application No. 2020-124365 filed on Jul. 21, 2020 and is a Continuation Application of PCT Application No. PCT/JP2021/026064 filed on Jul. 12, 2021. The entire contents of each application are hereby incorporated herein by reference.

BACKGROUND OF THE INVENTION

1. Field of the Invention

The present invention relates to a resin multilayer substrate including a metal foil layer and a resin layer.

2. Description of the Related Art

As an invention related to an existing resin multilayer substrate, for example, a multilayer circuit substrate described in International Publication No. 2011/007659 is known. The multilayer circuit substrate includes an upper resin layer, a lower resin layer, and a metal foil layer. The upper resin layer is stacked on the lower resin layer. The metal foil layer is arranged between the upper resin layer and the lower resin layer. An upper main surface of the metal foil layer is in contact with the upper resin layer. A lower main surface of the metal foil layer is in contact with the lower resin layer. A surface roughness of the lower main surface of the metal foil layer is greater than a surface roughness of the upper main surface of the metal foil layer. Accordingly, the strength of the metal foil layer in close contact with the lower resin layer is stronger than the strength of the metal foil layer in close contact with the upper resin layer. As a result, peeling of the metal foil layer from the lower resin layer is prevented.

SUMMARY OF THE INVENTION

However, in the multilayer circuit substrate described in International Publication No. 2011/007659, the metal foil layer and the upper resin layer may be separated from each other. In this case, the upper resin layer and the lower resin layer may be separated from each other.

Preferred embodiments of the present invention provide resin multilayer substrates in each of which an upper resin layer and a lower resin layer are not easily separated from each other.

The inventor of the present application studied the following method to prevent the upper resin layer and the lower resin layer from being separated from each other. Both the main surfaces of the metal foil layer are roughened and both the main surfaces of the metal foil layer are fixed to the resin multilayer substrate. However, the inventor of the present application discovered that in a multilayer circuit substrate using a metal foil layer as a transmission line, when both the main surfaces of the metal foil layer in contact with a resin substrate layer are roughened, transmission loss is more likely to occur in an electric signal flowing through the metal foil layer than when one main surface of the metal foil layer is roughened.

Therefore, the inventor of the present application has studied a method of making it difficult for the upper resin layer and the lower resin layer to be separated from each other and reducing or preventing an increase in the transmission loss, and has conceived of and developed the following preferred embodiments of the present invention.

A resin multilayer substrate according to a preferred embodiment of the present invention includes a metal foil layer, an upper resin layer, and a lower resin layer, the metal foil layer including a metal foil layer upper main surface, a metal foil layer lower main surface having a surface roughness greater than a surface roughness of the metal foil layer upper main surface, and a metal foil layer side surface that is a surface of the metal foil layer excluding the metal foil layer upper main surface and the metal foil layer lower main surface, the metal foil layer upper main surface being in contact with the upper resin layer, the metal foil layer lower main surface is in contact with the lower resin layer, a portion of a lower main surface of the upper resin layer and a portion of an upper main surface of the lower resin layer being in contact with each other to define a layer interface, in a cross section of the metal foil layer parallel or substantially parallel to a multilayer body up-down direction, a direction from an inner side of a region surrounded by a surface of the metal foil layer toward an outer side portion of a region surrounded by the surface of the metal foil layer of directions perpendicular or substantially perpendicular to the multilayer body up-down direction is defined as an inside-outside direction, in a cross section of the metal foil layer parallel or substantially parallel to a multilayer body up-down direction, the metal foil layer side surface includes an outer point and an inner point located at a portion where the upper resin layer is in contact with the side surface, and the inner point is located below the outer point and is located inward of the outer point in the inside-outside direction.

Hereinafter, definitions of terms in the present specification will be described. In this specification, an axis or a member extending in a front-back direction does not necessarily indicate only an axis or a member parallel or substantially parallel to the front-back direction. The axis or the member extending in the front-back direction is an axis or a member inclined in a range of about ±45° with respect to the front-back direction. Similarly, an axis or a member extending in the up-down direction is an axis or a member inclined in a range of about ±45° with respect to the up-down direction. An axis or a member extending in a left-right direction is an axis or a member inclined in a range of about ±45° with respect to the left-right direction.

Hereinafter, a first member is a member or the like included in a high-frequency signal transmission line. In the present specification, unless otherwise specified, each portion of the first member is defined as follows. A front portion of the first member is a front half of the first member. A back portion of the first member is a back half of the first member. A left portion of the first member is a left half of the first member. A right portion of the first member is a right half of the first member. An upper portion of the first member is an upper half of the first member. A lower portion of the first member is a lower half of the first member. A front end of the first member is an end in a forward direction of the first member. A back end of the first member is an end in a backward direction of the first member. A left end of the first member is an end in a leftward direction of the first member. A right end of the first member is an end in a rightward direction of the first member. An upper end of the first member is an end in an upward direction of the first member. A lower end of the first member is an end in a downward direction of the first member. A front end portion of the first member is the front end of the first member and the vicinity thereof. A back end portion of the first member is the back end of the first member and the vicinity thereof. A left end portion of the first member is the left end of the first member and the vicinity thereof. A right end portion of the first member is the right end of the first member and the vicinity thereof. An upper end portion of the first member is the upper end of the first member and the vicinity thereof. A lower end portion of the first member is the lower end of the first member and the vicinity thereof.

According to the resin multilayer substrates of preferred embodiments of the present invention, the upper resin layer and the lower resin layer are not easily separated from each other.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a side view of the high-frequency signal transmission line 10 including a bent portion to connect two circuits.

FIG. 5 is an exploded perspective view of the high-frequency signal transmission line 10 that is not bent.

FIG. 6 is a cross-sectional view taken along line A-A of FIG. 4.

FIG. 7 is a cross-sectional view of the high-frequency signal transmission line 10 including an adhesive layer formed of an adhesive.

FIG. 8 is a cross-sectional view of a high-frequency signal transmission line 10a according to a first modification of a preferred embodiment of the present invention taken along line A-A.

FIG. 9 is a cross-sectional view of a high-frequency signal transmission line 10b according to a second modification of a preferred embodiment of the present invention taken along line A-A.

FIG. 10 is a cross-sectional view of a high-frequency signal transmission line 10b2 according to the second modification taken along line A-A.

FIG. 11 is a cross-sectional view of a high-frequency signal transmission line 10c according to a third modification of a preferred embodiment of the present invention taken along line A-A.

FIG. 12 is a cross-sectional view of a high-frequency signal transmission line 10d according to a fourth modification of a preferred embodiment of the present invention taken along line A-A.

DETAILED DESCRIPTION OF THE PREFERRED EMBODIMENTS

Figure 1:
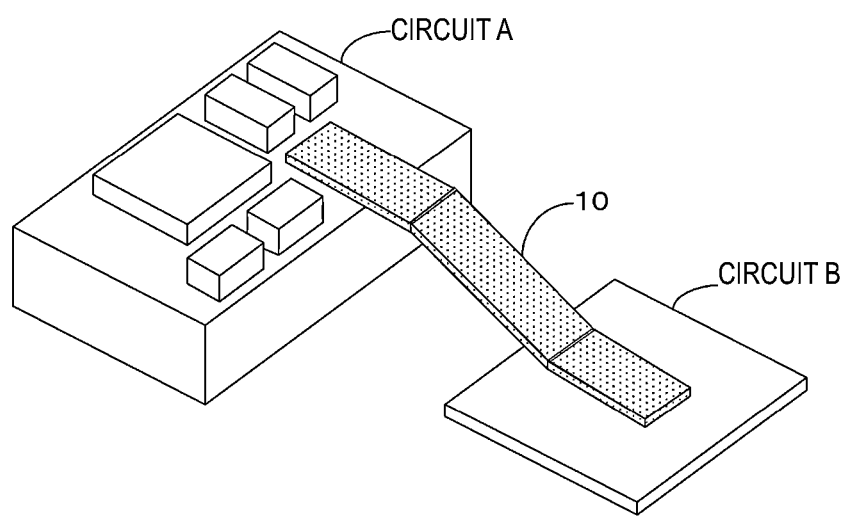
FIG. 1 is an external perspective view of a high-frequency signal transmission line 10 including a bent portion to connect two circuits.
Figure 3:
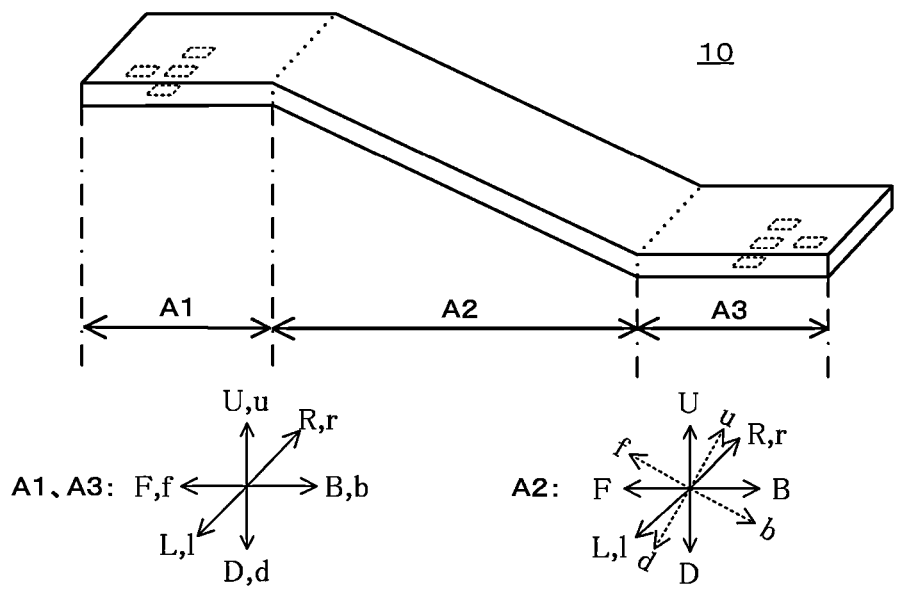
FIG. 3 is an external perspective view of the high-frequency signal transmission line 10 including a bent portion.
Figure 4:
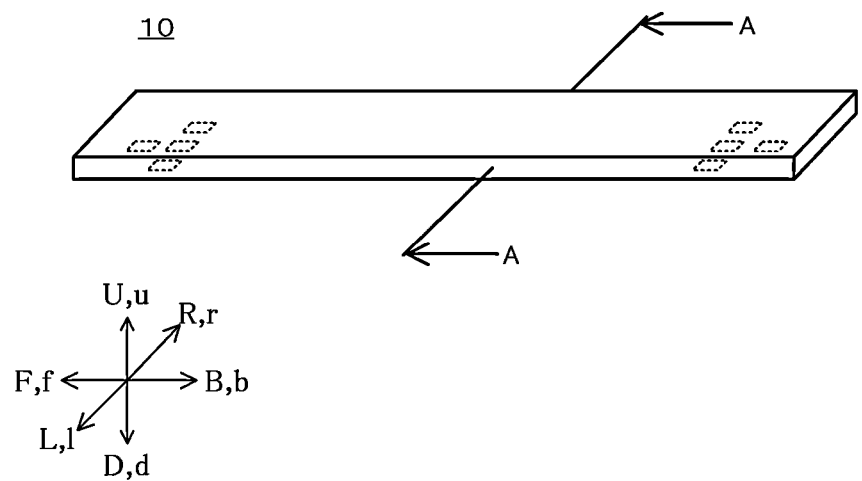
FIG. 4 is an external perspective view of the high-frequency signal transmission line 10 that is not bent.

A high-frequency signal transmission line 10 according to a first preferred embodiment of the present invention will be described with reference to the drawings. FIG. 1 is an external perspective view of the high-frequency signal transmission line 10 including a bent portion to connect two circuits. FIG. 2 is a side view of the high-frequency signal transmission line 10 including a bent portion connecting two circuits. FIG. 3 is an external perspective view of the high-frequency signal transmission line 10 including a bent portion. FIG. 4 is an external perspective view of the high-frequency signal transmission line 10 that is not bent. FIG. 5 is an exploded perspective view of the high-frequency signal transmission line 10 that is not bent. FIG. 6 is a cross-sectional view taken along line A-A illustrated in FIG. 4. Note that in FIG. 1 and FIG. 2, the high-frequency signal transmission line 10 is indicated by a dot pattern. In addition, in FIG. 2, components provided at an upper end of a circuit A other than the high-frequency signal transmission line 10 are not shown. Further, in FIG. 3, illustration of a circuit to which the high-frequency signal transmission line 10 is connected is omitted.

In addition, in the present specification, directions are defined as follows. A stacking direction of an element body 15 of the high-frequency signal transmission line 10 is defined as a multilayer body up-down direction. A longitudinal direction of the element body 15 is defined as a multilayer body front-back direction. A lateral direction of the element body 15 is defined as a multilayer body left-right direction. The multilayer body up-down direction, the multilayer body front-back direction, and the multilayer body left-right direction are perpendicular or substantially perpendicular to each other. Note that the definitions of the direction and the stacking direction in the present specification are examples. Therefore, the direction in actual use of the high-frequency signal transmission line 10 does not need to coincide with the direction in the present specification.

The high-frequency signal transmission line 10 (corresponding to a resin multilayer substrate) is used to connect two circuits in an electronic device such as a mobile phone. The high-frequency signal transmission line 10 has flexibility. Therefore, the high-frequency signal transmission line 10 can be used in an electronic device in a bent state in the up-down direction (planar direction). For example, as illustrated in FIG. 1 and FIG. 2, the high-frequency signal transmission line 10 can connect the circuit A and a circuit B in the bent state in the up-down direction. Note that the high-frequency signal transmission line 10 having a bent shape also has flexibility. Therefore, the high-frequency signal transmission line 10 in the bent state can be further bent.

As illustrated in FIG. 2 and FIG. 3, the high-frequency signal transmission line 10 includes non-curved sections A1 and A3 and a curved section A2. The non-curved sections A1 and A3 are sections in which the high-frequency signal transmission line 10 is not bent in the up-down direction. The curved section A2 is a section in which the high-frequency signal transmission line 10 includes a portion that is bent in the up-down direction. The non-curved section A1 is adjacent to the curved section A2. The non-curved section A1 is located to the left of the curved section A2. The non-curved section A3 is adjacent to the curved section A2. The non-curved section A3 is located to the right of the curved section A2.

In this case, as illustrated in FIG. 2 and FIG. 3, the multilayer body up-down direction and the multilayer body front-back direction differ depending on the position of the high-frequency signal transmission line 10. In the non-curved section A1 where the high-frequency signal transmission line 10 is not bent (for example, at a position (1) in FIG. 2), the multilayer body up-down direction and the multilayer body front-back direction coincide with the up-down direction and the front-back direction, respectively. On the other hand, in the curved section A2 where the high-frequency signal transmission line 10 is bent (for example, at a position (2) in FIG. 2), the multilayer body up-down direction and the multilayer body front-back direction do not coincide with the up-down direction and the front-back direction, respectively.

Next, the structure of the high-frequency signal transmission line 10 will be described with reference to FIG. 4 and FIG. 5. Note that FIG. 4 and FIG. 5 illustrate the state where the high-frequency signal transmission line 10 is not bent. In this case, the high-frequency signal transmission line 10 includes only a non-curved section that is not bent. Therefore, in the high-frequency signal transmission line 10 illustrated in FIG. 4 and FIG. 5, the multilayer body up-down direction and the multilayer body front-back direction coincide with the up-down direction and the front-back direction, respectively. As illustrated in FIG. 4 and FIG. 5, the high-frequency signal transmission line 10 includes a resin layer 16a (corresponding to an upper resin layer), a resin layer 16b (corresponding to a lower resin layer), resist layers 17a and 17b (corresponding to a protective film), a signal conductor layer 18 (corresponding to a metal foil layer), a first ground conductor layer 20 (corresponding to a metal foil layer), a second ground conductor layer 22 (corresponding to a metal foil layer), outer electrodes 24 and 26, a plurality of first interlayer connection conductors v1, a plurality of second interlayer connection conductors v2, and interlayer connection conductors v11 and v12.

Note that in FIG. 5, representative interlayer connection conductors among the plurality of first interlayer connection conductors v1 and the plurality of second interlayer connection conductors v2 are denoted by reference numerals.

As illustrated in FIG. 5, each of the resin layers 16a and 16b has a rectangular or substantially rectangular shape having long sides extending in the front-back direction when viewed in the up-down direction. Therefore, the length of the resin layers 16a and 16b in the front-back direction is longer than the length of the resin layers 16a and 16b in the left-right direction. The length of the resin layers 16a and 16b in the front-back direction is longer than the length of the resin layers 16a and 16b in the up-down direction. The resin layers 16a and 16b have flexibility. The resin layers 16a and 16b are flexible dielectric sheets. The resin layers 16a and 16b are made of thermoplastic resin such as polyimide and liquid crystal polymer. Such resin layers 16a and 16b define the element body 15. More specifically, the element body 15 has a structure in which the resin layers 16a and 16b are stacked in the up-down direction. The resin layers 16a and 16b are stacked so as to be arranged in this order from top to bottom.

Thus, the element body 15 has a plate shape. As illustrated in FIG. 5, the element body 15 has a rectangular or substantially rectangular shape having longer sides extending in the front-back direction when viewed in the up-down direction. Therefore, the length of the element body 15 in the front-back direction is longer than the length of the element body 15 in the left-right direction. The length of the element body 15 in the front-back direction is longer than the length of the element body 15 in the up-down direction.

The signal conductor layer 18 is provided on an upper main surface of the resin layer 16b. Thus, the signal conductor layer 18 is provided in the element body 15. As illustrated in FIG. 5, the signal conductor layer 18 has a linear shape extending in the front-back direction. The signal conductor layer 18 is arranged at the center in the left-right direction of the upper main surface of the resin layer 16b. A front end of the signal conductor layer 18 is located at a front end portion of the resin layer 16b. A back end of the signal conductor layer 18 is located at the back end portion of the resin layer 16b. In the high-frequency signal transmission line 10, the signal conductor layer 18 is a metal foil layer. The signal conductor layer 18 is a type of circuit pattern. Therefore, the circuit pattern is defined by the metal foil layer. A high-frequency signal is transmitted to the signal conductor layer 18.

The first ground conductor layer 20 is provided on an upper main surface of the resin layer 16a. Thus, the first ground conductor layer 20 is located on the signal conductor layer 18. In the present specification, the state "the first ground conductor layer 20 is located on the signal conductor layer 18 in the up-down direction" is defined as follows. At least a portion of the first ground conductor layer 20 is located in a region through which the signal conductor layer 18 passes when moving in parallel or substantially parallel in the upward direction. Thus, the first ground conductor layer 20 may be within the region through which the signal conductor layer 18 passes when moving in parallel or substantially parallel in the upward direction, or may project from the region through which the signal conductor layer 18 passes when moving in parallel or substantially parallel. In the present preferred embodiment, the first ground conductor layer 20 projects from the region through which the signal conductor layer 18 moves in parallel or substantially parallel.

As illustrated in FIG. 5, the first ground conductor layer 20 has a rectangular or substantially rectangular shape having long sides extending in the front-back direction when viewed in the up-down direction. The first ground conductor layer 20 has a shape that substantially coincides with the shape of the resin layer 16a when viewed in the up-down direction. However, the first ground conductor layer 20 is slightly smaller than the resin layer 16a when viewed in the up-down direction. A ground is connected to the first ground conductor layer 20.

The second ground conductor layer 22 is provided on a lower main surface of the resin layer 16b. Thus, the second ground conductor layer 22 is located under the signal conductor layer 18. As illustrated in FIG. 5, the second ground conductor layer 22 has a rectangular or substantially rectangular shape having longer sides extending in the front-back direction when viewed in the up-down direction. The second ground conductor layer 22 has a shape that substantially coincides with the shape of the resin layer 16b when viewed in the up-down direction. However, the second ground conductor layer 22 is slightly smaller than the resin layer 16b when viewed in the up-down direction. A ground is connected to the second ground conductor layer 22. The first ground conductor layer 20 and the second ground conductor layer 22 described above have a strip line structure.

The outer electrode 24 is provided at the front end portion of the lower main surface of the resin layer 16b. The outer electrode 24 has a rectangular or substantially rectangular shape when viewed in the up-down direction. The outer electrode 24 overlaps a front end portion of the signal conductor layer 18 when viewed in the up-down direction. The second ground conductor layer 22 is not provided around the outer electrode 24 so that the outer electrode 24 is insulated from the second ground conductor layer 22. The outer electrode 26 has a structure symmetrical to the outer electrode 24 in the front-back direction. Therefore, the description of the outer electrode 26 is omitted. The signal conductor layer 18, the first ground conductor layer 20, the second ground conductor layer 22, and the outer electrodes 24 and 26 described above are formed by, for example, etching a copper foil provided on the upper main surface or the lower main surface of each of the resin layers 16a and 16b.

The plurality of first interlayer connection conductors v1 is provided in the element body 15 so as to be located on the left of the signal conductor layer 18. The plurality of first interlayer connection conductors v1 is arranged in a row at equal or substantially equal intervals in the front-back direction. The plurality of first interlayer connection conductors v1 penetrates the resin layers 16a and 16b in the up-down direction. Upper ends of the plurality of first interlayer connection conductors v1 are connected to the first ground conductor layer 20. Lower ends of the plurality of first interlayer connection conductors v1 are connected to the second ground conductor layer 22. Thus, the plurality of first interlayer connection conductors v1 electrically connects the first ground conductor layer 20 and the second ground conductor layer 22.

The plurality of second interlayer connection conductors v2 is provided in the element body 15 so as to be located on the right of the signal conductor layer 18. The plurality of second interlayer connection conductors v2 is arranged in a row at equal or substantially equal intervals in the front-back direction. The plurality of second interlayer connection conductors v2 penetrates the resin layers 16a and 16b in the up-down direction. The upper ends of the plurality of second interlayer connection conductors v2 are connected to the first ground conductor layer 20. The lower ends of the plurality of second interlayer connection conductors v2 are connected to the second ground conductor layer 22. Thus, the plurality of second interlayer connection conductors v2 electrically connects the first ground conductor layer 20 and the second ground conductor layer 22.

The interlayer connection conductor v11 is provided at a front end portion of the element body 15. The interlayer connection conductor v11 penetrates the resin layer 16b in the up-down direction. An intermediate portion of the interlayer connection conductor v11 is connected to the front end portion of the signal conductor layer 18. A lower end of the interlayer connection conductor v11 is connected to the outer electrode 24. Thus, the interlayer connection conductor v11 electrically connects the signal conductor layer 18 and the outer electrode 24. Note that the interlayer connection conductor v12 has a structure symmetrical with the interlayer connection conductor v11 in the front-back direction. Therefore, description of the interlayer connection conductor v12 will be omitted. The interlayer connection conductors v1, v2, v11, and v12 are through-hole conductors. The through-hole conductors are formed by plating through-holes formed in the resin layers 16a and 16b. Note that the interlayer connection conductors v1, v2, v11, and v12 may be via-hole conductors.

The resist layers 17a and 17b have the same rectangular or substantially rectangular shape as the element body 15 when viewed in the up-down direction. The resist layers 17a and 17b are not portion of the element body 15. The material of the resist layers 17a and 17b is different from the material of the element body 15. That is, the resist layers 17a and 17b are layers different from the element body 15. As illustrated in FIG. 5 and FIG. 6, the resist layer 17a covers the surface of the element body 15. To be specific, the resist layer 17a is provided on an upper main surface of the element body 15. The resist layer 17a is a protective film and covers the first ground conductor layer 20. Thus, the resist layer 17a protects the first ground conductor layer 20. However, since a lower main surface of the first ground conductor layer 20 is fixed to the element body 15, the lower main surface is not covered with the resist layer 17a. The resist layer 17a like this is a resist, a coverlay, or the like. For example, when the resist layer 17a is a resist, the upper main surface of the resin layer 16a is coated with the resist. When the resist layer 17a is a coverlay, the resin layer 16a and the resist layer 17a are bonded to each other by an adhesive (not shown) or the like.

As illustrated in FIG. 5 and FIG. 6, the resist layer 17b covers the surface of the element body 15. To be specific, the resist layer 17b is provided under a lower main surface of the element body 15. The resist layer 17b covers the second ground conductor layer 22. Thus, the resist layer 17b protects the second ground conductor layer 22. However, since an upper main surface of the second ground conductor layer 22 is fixed to the element body 15, the upper main surface is not covered with the resist layer 17b. Similar to the resist layer 17a, the resist layer 17b is a resist, a coverlay, or the like.

Openings h11 to h18 are provided in the resist layer 17b. When the resist layer 17b is viewed in the downward direction, the opening h11 overlaps the outer electrode 24. When the resist layer 17b is viewed in the downward direction, the opening h15 overlaps the outer electrode 26. Thus, the outer electrodes 24 and 26 are exposed to the outside from the high-frequency signal transmission line 10 through the openings h11 and h15, respectively. The opening h12 is provided to the right of the opening h11. The opening h13 is provided in front of the opening h11. The opening h14 is provided to the left of the opening h11. Thus, the second ground conductor layer 22 is exposed to the outside from the high-frequency signal transmission line 10 through the openings h12 to h14. Note that the openings h16 to h18 have structures symmetrical to the openings h12 to h14 in the front-back direction. Therefore, description of the openings h16 to h18 will be omitted.

Openings h19 and h20 are provided in the second ground conductor layer 22. The diameters of the openings h19 and h20 are larger than the diameters of the outer electrodes 24 and 26. Therefore, when viewed in the up-down direction, the outer electrode 24 and the outer electrode 26 are not inscribed in the openings h19 and h20, respectively. Thus, the outer electrodes 24 and 26 and the second ground conductor layer 22 are not short-circuited.

Meanwhile, the high-frequency signal transmission line 10 has a structure that prevents the resin layer 16a and the resin layer 16b from being separated from each other. This structure will be described in more detail below.

As illustrated in FIG. 6, the signal conductor layer 18 includes a signal conductor layer upper main surface S1 (metal foil layer upper main surface), a signal conductor layer lower main surface S2 (metal foil layer lower main surface), and a signal conductor layer side surface S3 (metal foil layer side surface). In the present specification, the signal conductor layer upper main surface S1 is a portion that is visible when the signal conductor layer 18 is viewed in the downward direction. The signal conductor layer lower main surface S2 is a portion that is visible when the signal conductor layer 18 is viewed in the upward direction. In addition, the signal conductor layer side surface S3 is a surface of the signal conductor layer 18 excluding the signal conductor layer upper main surface S1 and the signal conductor layer lower main surface S2. Note that the signal conductor layer 18 may have any shape as long as the shape is defined by the signal conductor layer upper main surface S1, the signal conductor layer lower main surface S2, and the signal conductor layer side surface S3. In the present preferred embodiment, the signal conductor layer 18 has a rectangular or substantially rectangular shape defined by one signal conductor layer upper main surface S1, one signal conductor layer lower main surface S2, and four signal conductor layer side surfaces S3.

The signal conductor layer lower main surface S2 of the signal conductor layer 18 is in contact with the resin layer 16b. More precisely, the signal conductor layer lower main surface S2 of the signal conductor layer 18 is in contact with the upper main surface of the resin layer 16b. The signal conductor layer lower main surface S2 of the signal conductor layer 18 is roughened. Therefore, it is possible to prevent separation between the signal conductor layer lower main surface S2 of the signal conductor layer 18 and the resin layer 16b. In addition, the signal conductor layer upper main surface S1 of the signal conductor layer 18 is in contact with the resin layer 16a. More precisely, the signal conductor layer upper main surface S1 of the signal conductor layer 18 is in contact with the lower main surface of the resin layer 16a. The upper main surface of the signal conductor layer 18 is not roughened to prevent an increase in transmission loss of electric signals. Therefore, the resin layer 16a is not fixed to the signal conductor layer 18. Thus, the close-contact strength of the signal conductor layer 18 to the resin layer 16b is stronger than the close-contact strength of the signal conductor layer 18 to the resin layer 16a.

The signal conductor layer 18 is provided between the resin layer 16a and the resin layer 16b. As such, the resin layer 16a and the resin layer 16b are not in contact with each other over the entire lower main surface of the resin layer 16a and the entire upper main surface of the resin layer 16b. Therefore, a portion of the lower main surface of the resin layer 16a is in contact with a portion of the upper main surface of the resin layer 16b. Thus, a layer interface RI between the resin layer 16a and the resin layer 16b is formed. The layer interface RI is provided at a portion where the lower main surface of the resin layer 16a and the upper main surface of the resin layer 16b are in contact with each other. Therefore, the layer interface RI is not located in a portion where the signal conductor layer 18 is provided.

Here, the shape of the side surface of the signal conductor layer 18 will be described in more detail. Hereinafter, attention is paid to the right side surface of the signal conductor layer 18. First, in a cross section parallel or substantially parallel to the multilayer body up-down direction (i.e., the cross section of FIG. 6), a direction from an inner side of a region surrounded by the surfaces of the signal conductor layer 18 toward an outer side portion of the region surrounded by the surfaces of the signal conductor layer 18 among directions perpendicular or substantially perpendicular to the multilayer body up-down direction is defined as an inside-outside direction. Specifically, in a cross section parallel or substantially parallel to the multilayer body up-down direction, a point located at the inner side of the region surrounded by the surfaces of the signal conductor layer 18 is defined as a point X. A point located at the outer side portion of the region surrounded by the surfaces of the signal conductor layer 18 is defined as a point Y. The position of the point X in the multilayer body up-down direction is the same as the position of the point Y in the multilayer body up-down direction. At this time, the inside-outside direction is a direction from the point X toward the point Y (see FIG. 6). On the right side surface of the signal conductor layer 18, the inside-outside direction is the rightward direction.

The side surface of the signal conductor layer 18 has a cross-sectional shape obtained by rotating the V-shape by 90°. Specifically, the side surface of the signal conductor layer 18 includes an inclined surface extending outward and upward from the center of the side surface of the signal conductor layer 18 in the multilayer body up-down direction and an inclined surface extending outward and downward from the center of the side surface of the signal conductor layer 18 in the multilayer body up-down direction. As described above, since the side surface of the signal conductor layer 18 has the inclined surface extending outward and upward from the center of the side surface of the signal conductor layer 18 in the multilayer body up-down direction, the signal conductor layer 18 has a structure described below.

The side surface of the signal conductor layer 18 includes an outer point OP and an inner point IP in a cross section parallel or substantially parallel to the multilayer body up-down direction. The outer point OP is located at a portion where the resin layer 16a is in contact with the side surface. As illustrated in FIG. 6, the right side surface of the signal conductor layer 18 includes the outer point OP in a cross section perpendicular or substantially perpendicular to the front-back direction. The side surface of the signal conductor layer 18 includes the inner point IP in a cross section parallel or substantially parallel to the multilayer body up-down direction. The inner point IP is located at a portion where the resin layer 16a is in contact with the side surface. The inner point IP is located below the outer point OP and is located inward of the outer point OP in the inside-outside direction. On the right side surface of the signal conductor layer 18 illustrated in FIG. 6, the inside-outside direction is the rightward direction. Therefore, the right side surface of the signal conductor layer 18 includes the inner point IP located below and to the left of the outer point OP in the cross section perpendicular or substantially perpendicular to the front-back direction.

The outer point OP and the inner point IP are located at portions where the side surface of the signal conductor layer 18 and the resin layer 16a are in contact with each other. Therefore, the outer point OP and the inner point IP are not located in a portion where the side surface of the signal conductor layer 18 and the resin layer 16b are in contact with each other. In other words, the outer point OP and the inner point IP are not located below the layer interface RI. Note that since the left side surface of the signal conductor layer 18 has a bilaterally symmetrical structure with respect to the right side surface of the signal conductor layer 18, description thereof will be omitted.

According to the high-frequency signal transmission line 10, the resin layer 16a is prevented from being peeled off from the resin layer 16b. More specifically, in a cross section of the signal conductor layer 18 parallel or substantially parallel to the multilayer body up-down direction, the side surface of the signal conductor layer 18 has the outer point OP and the inner point IP located at a portion where the resin layer 16a is in contact with the side surface of the signal conductor layer 18. Further, the inner point IP is located below the outer point OP and is located inward of the outer point OP in the inside-outside direction. Therefore, the resin layer 16a is located under a portion P0 between the outer point OP and the inner point IP on the side surface of the signal conductor layer 18. As such, even when the resin layer 16a is about to peel off from the signal conductor layer 18, the resin layer 16a is caught by the portion P0. Thus, the resin layer 16a is prevented from being peeled off from the signal conductor layer 18. As a result, peeling of the resin layer 16a from the resin layer 16b due to peeling of the resin layer 16a from the signal conductor layer 18 is prevented.

In addition, since only the lower main surface of the signal conductor layer 18 is roughened, it is also possible to prevent or reduce an increase in transmission loss of an electric signal.

Method of Manufacturing High-Frequency Signal Transmission Line 10

Hereinafter, a non-limiting example of a method of manufacturing the high-frequency signal transmission line 10 will be described with reference to FIG. 6.

First, in a first step, the resin layer 16a including the metal foil layer attached to the upper main surface and the resin layer 16b including the metal foil layer attached to the upper main surface and the lower main surface are prepared.

Next, in a second step, the metal foil layer attached to the upper main surface of the resin layer 16a is etched to form the first ground conductor layer 20. The signal conductor layer 18, the second ground conductor layer 22, and the outer electrodes 24 and 26 are formed by etching the metal foil layers attached to the upper main surface and the lower main surface of the resin layer 16b. In the etching process, for example, a mask having the same shape as the first ground conductor layer 20 is formed on the metal foil layer attached to the upper main surface of the resin layer 16a, and etching treatment is applied on the metal foil layer on which the mask is formed. Thus, the first ground conductor layer 20 is formed. Similarly, the metal foil layers attached to the upper main surface and the lower main surface of the resin layer 16b are etched and the signal conductor layer 18, the second ground conductor layer 22, and the outer electrodes 24 and 26 are formed.

Next, in a third step, the signal conductor layer 18 is deformed and processed, thus forming a side surface of the signal conductor layer 18 including the outer point OP located on the outermost side and the inner point IP located below the outer point OP and located on the inner side in the inside-outside direction. The third step is, for example, a wet blasting method.

Next, as a fourth step, the resin layer 16a is stacked on the signal conductor layer 18 and the resin layer 16b. To be specific, the resin layer 16a is hot-pressed from above the signal conductor layer 18 and the resin layer 16b. The resin layer 16a is made of thermoplastic resin (for example, liquid crystal polymer). Therefore, the resin layer 16a softens and flows during hot pressing. The fluidized resin layer 16a enters under the portion P0 between the outer point OP and the inner point IP. Then, the temperature of the resin layer 16a that has entered under the portion P0 returns to room temperature and the resin layer 16a solidifies. At this time, the solidified resin layer 16a is caught by the portion P0. Therefore, the resin layer 16a is prevented from being peeled off from the resin layer 16b. That is, in the present step, when the outer point OP and the inner point IP are formed such that the fluidized resin layer 16a enters under the portion P0 between the outer point OP and the inner point IP, the resin layer 16a is prevented from being peeled off from the resin layer 16b. As described above, in the fourth step, by using the resin layer 16a made of thermoplastic resin, it is possible to cause the resin layer 16a to easily enter under the portion P0.

Note that the high-frequency signal transmission line 10 may include an adhesive layer between the resin layer 16a and the resin layer 16b. To be specific, as illustrated in FIG. 7, in the high-frequency signal transmission line 10, instead of the resin layer 16a, an adhesive layer 19 may be stacked on the signal conductor layer 18 and the resin layer 16b. The adhesive layer 19 is formed of a material that solidifies at a temperature lower than the melting temperature of the resin layer 16b. The adhesive layer 19 is, for example, a thermoplastic material such as LCP or fluorine resin having a melting temperature lower than that of the resin layer 16b. Alternatively, the adhesive layer 19 is made of, for example, a thermosetting material such as an elastomer material or an epoxy resin having high fluidity even at a temperature lower than the melting temperature of the resin layer 16b. At this time, the resin layer 16a is stacked on the adhesive layer 19. In this case, the adhesive layer 19 corresponds to the upper resin layer.

When the resin layer 16a and the resin layer 16b are made of the same material, there is a possibility that the resin layer 16b fixed to the signal conductor layer 18 may also flow and change in shape during hot pressing, as with the resin layer 16a. When the resin layer 16b flows and changes in shape, the electrical characteristics of the high-frequency signal transmission line 10 may change. On the other hand, the adhesive layer 19 solidifies at a temperature lower than the melting temperature of the resin layer 16b. Therefore, by performing hot pressing at a temperature at which the resin layer 16b does not flow and the adhesive layer 19 flows, it is possible to reduce the possibility that the shape of the resin layer 16b changes. As a result, when the adhesive layer 19 is used, it is possible to manufacture the high-frequency signal transmission line 10 while reducing the possibility of a change in electrical characteristics as compared with the case where the resin layer 16a is used.

Next, through-holes are formed by irradiating the resin layers 16a and 16b with a laser beam. Then, the interlayer connection conductors v1, v2, v11, and v12 are formed by forming conductors in the through-holes by plating. Note that the through-hole may be formed by a drill.

Finally, the openings h11 to h18 and the resist layers 17a and 17b are formed. Through the above steps, the high-frequency signal transmission line 10 is completed.

According to the non-limiting example of a manufacturing method of the high-frequency signal transmission line 10, it is possible to easily manufacture the high-frequency signal transmission line 10. More specifically, by stacking the resin layer 16a on the signal conductor layer 18 and the resin layer 16b formed in the second step, at least a portion of the resin layer 16b enters under the side surface of the signal conductor layer 18 where the outer point OP is formed. As a result, the high-frequency signal transmission line 10 can be easily manufactured.

In addition, according to the wet blasting method, the outer point OP and the inner point IP can be easily formed on all the side surfaces of the signal conductor layer 18. More specifically, the upper main surface of the signal conductor layer 18 is crushed by the wet blasting method. When the upper main surface of the signal conductor layer 18 is crushed, the side surface of the signal conductor layer 18 protrudes in the inside-outside direction, and the outer point OP and the inner point IP can be formed on all the side surfaces of the signal conductor layer 18.

First Modification

Hereinafter, a high-frequency signal transmission line 10a according to a first modification of a preferred embodiment of the present invention will be described with reference to the drawings. FIG. 8 is a cross-sectional view of the high-frequency signal transmission line 10a taken along line A-A. Note that FIG. 4 is referred to for the external perspective view of the high-frequency signal transmission line 10a.

As illustrated in FIG. 8, the high-frequency signal transmission line 10a is different from the high-frequency signal transmission line 10 in that the shape of a signal conductor layer 18a is different from the shape of the signal conductor layer 18. Note that since other configurations of the high-frequency signal transmission line 10a are the same as those of the high-frequency signal transmission line 10, descriptions thereof will be omitted.

The side surface of the signal conductor layer 18a has a cross-sectional shape that can be defined by one oblique line. To be specific, the side surface of the signal conductor layer 18a includes an inclined surface extending straight from an outer point OP1 located at an upper end of the side surface of the signal conductor layer 18 in the multilayer body up-down direction to an inner point IP1 located below the outer point OP1 and located inside the outer point OP1. In this case, the resin layer 16a is located below a portion P1 between the outer point OP1 and the inner point IP1 on the side surface of the signal conductor layer 18a. Therefore, the resin layer 16a is caught by the portion P1. Accordingly, the resin layer 16a is prevented from being peeled off from the resin layer 16b.

Second Modification

Hereinafter, a high-frequency signal transmission line 10b according to a second modification of a preferred embodiment of the present invention will be described with reference to the drawings. FIG. 9 is a cross-sectional view of the high-frequency signal transmission line 10b taken along line A-A. FIG. 10 is a cross-sectional view of a high-frequency signal transmission line 10b2 taken along line A-A. Note that FIG. 4 is referred to for the external perspective view of the high-frequency signal transmission line 10b.

As illustrated in FIG. 9, the high-frequency signal transmission line 10b is different from the high-frequency signal transmission line 10 in that the shape of a signal conductor layer 18b is different from the shape of the signal conductor layer 18. Note that since other configurations of a high-frequency signal transmission line 10b are the same as those of the high-frequency signal transmission line 10, descriptions thereof will be omitted.

A protrusion protruding outward is provided in the vicinity of the center of the right side surface of the signal conductor layer 18b. An outer point OP2 is located at the protrusion. An inner point IP2 is located at a portion where the right side surface of the signal conductor layer 18b and the layer interface RI are in contact with each other. Also in the present modification, the resin layer 16a is located below a portion P2 between the outer point OP2 and the inner point IP2. Therefore, the resin layer 16a is caught by the protrusion. Accordingly, the resin layer 16a is prevented from being peeled off from the resin layer 16b.

Note that the shape of the protrusion may be any shape. In addition, the protrusion does not necessarily extend in a direction parallel or substantially parallel to the multilayer body left-right direction. In the example illustrated in FIG. 9, the protrusion has a rectangular or substantially rectangular shape extending in a multilayer body rightward direction. However, for example, as illustrated in FIG. 10, the protrusion may have a triangular prism shape extending in the multilayer body rightward direction. In this case, as illustrated in FIG. 10, the protrusion has a triangular shape when viewed in the front-back direction. To be specific, the protrusion includes a first surface SS1 and a second surface SS2. The first surface SS1 is located above the second surface SS2. The second surface SS2 extends in the inside-outside direction when viewed in the front-back direction. When viewed in the front-back direction, the first surface SS1 extends in the inside-outside direction and in the multilayer body downward direction. When viewed in the front-back direction, the first surface SS1 and the second surface SS2 are in contact with each other at the outer point OP2. Even in this case, the resin layer 16a is located below the portion P2 between the outer point OP2 and the inner point IP2. Therefore, the resin layer 16a is prevented from being peeled off from the resin layer 16b.

Third Modification

Hereinafter, the high-frequency signal transmission line 10c according to a third modification of a preferred embodiment of the present invention will be described with reference to the drawings. FIG. 11 is a cross-sectional view of the high-frequency signal transmission line 10c taken along line A-A. Note that FIG. 4 is referred to for the external perspective view of the high-frequency signal transmission line 10c.

As illustrated in FIG. 11, the high-frequency signal transmission line 10c is different from the high-frequency signal transmission line 10 in that the shape of a first ground conductor layer 20b is different from the shape of the first ground conductor layer 20 and the shape of a second ground conductor layer 22b is different from the shape of the second ground conductor layer 22. Note that since other configurations of the high-frequency signal transmission line 10c are the same as those of the high-frequency signal transmission line 10, descriptions thereof will be omitted.

The side surface of the first ground conductor layer 20b includes an outer point OP3 located outermost in a portion where the resist layer 17a is in contact with the side surface in the inside-outside direction. In addition, the side surface of the first ground conductor layer 20b includes an inner point IP3 located below the outer point OP3 and inside the outer point OP3 in a portion where the resist layer 17a is in contact with the side surface in the inside-outside direction. The resist layer 17a is located under the portion P3 between the outer point OP3 and the inner point IP3 on the side surface of the first ground conductor layer 20b. Therefore, the resist layer 17a is caught by the portion P3. Thus, the resist layer 17a is prevented from being peeled off from the resin layer 16a. In this case, the first ground conductor layer 20b corresponds to the metal foil layer, the resist layer 17a corresponds to the upper resin layer, and the resin layer 16a corresponds to the lower resin layer.

Further, when the high-frequency signal transmission line 10c is viewed in the downward direction, the second ground conductor layer 22b corresponds to the metal foil layer, the resist layer 17b corresponds to the upper resin layer, and the resin layer 16b corresponds to the lower resin layer. Therefore, the resist layer 17b is prevented from being peeled off from the resin layer 16b.

As described above, the high-frequency signal transmission line 10c includes a plurality of sets of the upper resin layer, the lower resin layer, and the metal foil layer. More specifically, the high-frequency signal transmission line 10c includes three sets each having the upper resin layer, the lower resin layer, and the metal foil layer.

Fourth Modification

Hereinafter, a high-frequency signal transmission line 10d according to a fourth modification of a preferred embodiment of the present invention will be described with reference to the drawings. FIG. 12 is a cross-sectional view of the high-frequency signal transmission line 10d taken along line A-A.

As illustrated in FIG. 12, the high-frequency signal transmission line 10d is different from the high-frequency signal transmission line 10 in that a signal conductor layer 18d having a shape different from that of the signal conductor layer 18 is provided. Note that since other configurations of the high-frequency signal transmission line 10d are the same as those of the high-frequency signal transmission line 10, descriptions thereof will be omitted.

As illustrated in FIG. 12, the shape of the side surface of the signal conductor layer 18d is different from the shape of the side surface of the signal conductor layer 18. To be specific, a portion located below an inner point IP4 in the side surface of the signal conductor layer 18d is parallel or substantially parallel to the multilayer body up-down direction. Also in this case, similar to the high-frequency signal transmission line 10, the resin layer 16a is located below a portion P4 (see FIG. 12). Therefore, in the high-frequency signal transmission line 10d, the resin layer 16a is prevented from being peeled off from the resin layer 16b for the same reason as that of the high-frequency signal transmission line 10. In other words, when the resin layer 16a is located below the portion P4, the resin layer 16a is prevented from being peeled off from the resin layer 16b regardless of the shape of the side surface of the signal conductor layer 18d located below the inner point IP4.

Other Preferred Embodiments

It is not limited to the high-frequency signal transmission lines 10 and 10a to 10d according to the above-described preferred embodiments of the present invention, and it can be changed within the scope of the gist thereof. Further, it is possible to combine the configurations of the high-frequency signal transmission lines 10 and 10a to 10d.

In the high-frequency signal transmission lines 10 and 10a to 10d, the resin layer 16a and the resin layer 16b are not necessarily made of the same material, and may be made of different materials.

In the high-frequency signal transmission lines 10, 10b, 10b2, 10c, and 10d, the outer points OP, OP2, OP3, and OP4 do not necessarily need to be located above the center in the multilayer body up-down direction on the side surfaces of the signal conductor layers 18 and 18b and the first ground conductor layer 20b. In addition, in the high-frequency signal transmission lines 10, 10b, 10b2, 10c, and 10d, the inner points Ip, IP2, IP3, and IP4 do not necessarily need to be located below the center in the multilayer body up-down direction on the side surfaces of the signal conductor layers 18a and 18b and the first ground conductor layer 20b. In the high-frequency signal transmission lines 10, 10b, 10c, and 10d, and the side surface of the first ground conductor layer 20b, the outer points OP, OP2, OP3, and OP4 are located above the center of the side surfaces of the signal conductor layers 18a and 18b and the first ground conductor layer 20b in the multilayer body up-down direction, and the inner points IP, IP2, IP3, and IP4 may be located below the center of the side surfaces in the multilayer body up-down direction.

In the high-frequency signal transmission lines 10 and 10a to 10d, the resin layers 16a and 16b are not necessarily be made of thermoplastic resin.

In the high-frequency signal transmission lines 10 and 10a to 10d, the signal conductor layer 18 may be fixed to the resin layer 16a.

In the high-frequency signal transmission lines 10 and 10a to 10d, all the side surfaces of the signal conductor layer 18, 18a, 18b, and 18d may include the outer points OP and OP1 to OP4, and the inner points Ip and IP1 to IP4. In this case, in all cross sections of the signal conductor layer 18 parallel or substantially parallel to the multilayer body up-down direction, the outer points OP and OP1 to OP4 are located above the inner points IP and IP1 to IP4 and the layer interface RI. Alternatively, in the high-frequency signal transmission lines 10 and 10a to 10d, a partial side surface of the signal conductor layer 18 may include the outer points OP and OP1 to OP4, and the inner points IP and IP1 to IP4.

The left side surface of the signal conductor layer 18 may have a left-right asymmetric structure with respect to the right side surface of the signal conductor layer 18. Similarly, the left side surface of the signal conductor layer 18d may have a left-right asymmetric structure with respect to the right side surface of the signal conductor layer 18d.

The left side surface of the first ground conductor layer 20b may have a left-right asymmetric structure with respect to the right side surface of the first ground conductor layer 20b. Similarly, the left side surface of the second ground conductor layer 22b may have a left-right asymmetric structure with respect to the right side surface of the second ground conductor layer 22b.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a metal foil layer, an upper resin layer, and a lower resin layer; wherein
   the metal foil layer includes a metal foil layer upper main surface, a metal foil layer lower main surface with a surface roughness greater than a surface roughness of the metal foil layer upper main surface, and a metal foil layer side surface that is a surface of the metal foil layer excluding the metal foil layer upper main surface and the metal foil layer lower main surface;
   the metal foil layer upper main surface is in contact with the upper resin layer;
   the metal foil layer lower main surface is in contact with the lower resin layer;
   a portion of a lower main surface of the upper resin layer and a portion of an upper main surface of the lower resin layer are in contact with each other to define a layer interface;
   in a cross section of the metal foil layer parallel or substantially parallel to a multilayer body up-down direction, a direction from an inner side of a region surrounded by a surface of the metal foil layer toward an outer side portion of a region surrounded by the surface of the metal foil layer of directions perpendicular or substantially perpendicular to the multilayer body up-down direction is defined as an inside-outside direction;
   in a cross section of the metal foil layer parallel or substantially parallel to a multilayer body up-down direction, the metal foil layer side surface includes an outer point and an inner point located at a portion where the upper resin layer is in contact with the side surface; and
   the inner point is located below the outer point and is located inward of the outer point in the inside-outside direction.

2. The resin multilayer substrate according to claim 1, wherein a circuit pattern is defined by the metal foil layer.

3. The resin multilayer substrate according to claim 1, wherein the resin multilayer substrate has flexibility.

4. The resin multilayer substrate according to claim 1, wherein a signal conductor layer is defined by the metal foil layer.

5. The resin multilayer substrate according to claim 1, wherein the upper resin layer and the lower resin layer are made of a thermoplastic resin.

6. The resin multilayer substrate according to claim 1, wherein a metal foil layer is not fixed to the upper resin layer.

7. The resin multilayer substrate according to claim 1, wherein a material of the upper resin layer and a material of the lower resin layer are different from each other.

8. The resin multilayer substrate according to claim 1, wherein the upper resin layer is a protective film of the metal foil layer.

9. The resin multilayer substrate according to claim 1, wherein a plurality of sets each including the upper resin layer, the lower resin layer, and the metal foil layer is provided.

10. The resin multilayer substrate according to claim 1, wherein a close-contact strength of the metal foil layer to the lower resin layer is stronger than a close-contact strength of the metal foil layer to the upper resin layer.

11. The resin multilayer substrate according to claim 1, wherein the outer point is located above the inner point and the layer interface in all cross sections parallel or substantially parallel to the multilayer body up-down direction.

12. The resin multilayer substrate according to claim 1, wherein
the outer point is located above a center of the side surface in the multilayer body up-down direction; and
the inner point is located below a center of the side surface in the multilayer body up-down direction.

* * * * *